US012658913B1

(12) United States Patent 
Yan et al.

(10) Patent No.: US 12,658,913 B1 
(45) Date of Patent: Jun. 16, 2026

(54) SIGNAL CONVERTER

(71) Applicant: Novatek Microelectronics Corp., Hsinchu (TW)

(72) Inventors: Jing-Ren Yan, Changhua County (TW); Yu-Te Liao, Hsinchu City (TW)

(73) Assignee: Novatek Microelectronics Corp., Hsinchu (TW)

( * ) Notice: Subject to any disclaimer, the term of this patent is extended or adjusted under 35 U.S.C. 154(b) by 6 days.

(21) Appl. No.: 18/979,554

(22) Filed: Dec. 12, 2024

(51) Int. Cl. 
H02M 7/217 (2006.01) 
H03K 17/16 (2006.01)

(52) U.S. Cl. 
CPC .......... H03K 17/16 (2013.01); H02M 7/2173 (2013.01)

(58) Field of Classification Search 
CPC ...... H03K 17/693; H03K 5/01; H03K 17/687; H03K 17/6871; H03K 17/063; H03K 2217/0018; H03K 5/24; H03K 17/74; H03K 3/57; H03K 17/102; H03K 2005/00078; H03K 3/64; H03K 5/1252; H03K 17/22; H03K 17/56; H03K 17/941; H03K 19/017545; H03K 3/012; H03K 3/023; H03K 3/0233; H03K 17/08146; H03K 17/161; H03K 17/662; H03K 17/94; H03K 17/96; H03K 19/0175; H03K 2217/0036; H03K 7/06; H03K 7/08; H03K 9/00; H03K 17/007; H03K 17/04; H03K 17/162; H03K 17/28; H03K 17/51; H03K 17/60; H03K 17/6221; H03K 17/68; H03K 17/725; H03K 17/92; H03K 17/9547; H03K 17/955; H03K 19/0013; H03K 19/00315;

(Continued)

(56) References Cited

U.S. PATENT DOCUMENTS 6,630,898 B1 10/2003 Stegers 
7,733,168 B2 6/2010 Higuchi 
(Continued)

FOREIGN PATENT DOCUMENTS

CN 101313468 1/2011

OTHER PUBLICATIONS

Koji Kotani et al., "High-Efficiency Differential-Drive CMOS Rectifier for UHF RFIDs", IEEE Journal of Solid-State Circuits, vol. 44, No. 11, Nov. 2009, pp. 3011-3018.

(Continued)

*Primary Examiner* — John W Poos

(74) *Attorney, Agent, or Firm* — JCIPRNET

(57) ABSTRACT

A signal converter includes a first capacitor, a second capacitor, a first switch to a fourth switch, and a first feedback control circuit to a fourth feedback control circuit. The first switch and the second switch are coupled between a reference voltage end and an output end in series. The first switch and the second switch are respectively controlled by a first feedback control signal and a second feedback control signal. The third switch and a fourth switch are respectively controlled by a third feedback control signal and a fourth feedback control signal. The first feedback control circuit provides the first feedback control signal. The second feedback control circuit provides the second feedback control signal. The third feedback control circuit provides the third feedback control signal. The fourth feedback control circuit provides the fourth feedback control signal.

13 Claims, 14 Drawing Sheets

(58) Field of Classification Search

CPC .......... H03K 19/018557; H03K 19/08; H03K 2217/0081; H03K 2217/96042; H03K 2217/96062; H03K 3/02337; H03K 3/38; H03K 5/02; H03K 5/08; H03K 9/02; H03K 9/04; H03K 12/00; H03K 17/002; H03K 17/0406; H03K 17/04123; H03K 17/16; H03K 17/163; H03K 17/288; H03K 17/567; H03K 17/58; H03K 17/601; H03K 17/6872; H03K 17/6877; H03K 17/691; H03K 17/82; H03K 17/84; H03K 17/962; H03K 19/00; H03K 19/017509; H03K 19/09403; H03K 19/09429; H03K 19/1733; H03K 2017/307; H03K 21/08; H03K 2217/94089; H03K 25/00; H03K 3/02; H03K 3/30; H03K 3/354; H03K 3/53; H03K 3/537; H03K 3/78; H03K 4/28; H03K 4/64; H03K 5/04; H03K 5/06; H03K 6/04; H03K 7/04; H02M 7/217; H02M 1/32; H02M 7/219; H02M 7/06; H02M 1/0058; H02M 1/007; H02M 1/126; H02M 1/14; H02M 1/0064; H02M 1/009; H02M 1/08; H02M 1/088; H02M 1/38; H02M 1/44; H02M 3/01; H02M 3/158; H02M 3/20; H02M 3/33561; H02M 3/33573; H02M 3/33576; H02M 7/12; H02M 7/40; H02M 7/4815; H02M 7/4818; H02M 7/53871; H02M 1/0003; H02M 1/0009; H02M 1/0038; H02M 1/0048; H02M 1/4225; H02M 1/4258; H02M 3/07; H02M 3/135; H02M 3/1582; H02M 3/28; H02M 3/335; H02M 3/3376; H02M 7/02; H02M 7/062; H02M 7/10; H02M 7/48; H02M 7/4807; H02M 7/493; H02M 7/538; H02M 7/5387; H02M 7/66; H02M 7/2173; H02J 50/20; H02J 50/001; H02J 50/27; H02J 2105/46; H02J 50/80; H02J 2207/50; H02J 7/34; H02J 50/402; H02J 50/23; H02J 50/60; H02J 50/12; H02J 50/90; H02J 4/25; H02J 50/10; H02J 50/30; H02J 50/40; H02J 7/00; H02J 7/35; H02J 7/70; H03H 7/40; H03H 7/38; H03H 19/002; H03H 7/0115; H03H 17/06; H03H 7/427; H03H 11/04; H03H 11/02; H03H 11/28; H03H 5/12; H03H 7/01; H03H 19/008; H03H 3/0077; H03H 2001/0057; H03H 11/48; H03H 11/481; H03H 7/0138; H03H 17/0045; H03H 17/02; H03H 7/09; H03H 7/1758; H03H 7/18; H03H 7/19

See application file for complete search history.

(56) References Cited

U.S. PATENT DOCUMENTS

| | | | | |
|---|---|---|---|---|
| 10,312,743 | B2 * | 6/2019 | Ouda ..................... | H02J 50/20 |
| 11,381,239 | B1 | 7/2022 | Lesso et al. | |
| 2003/0218558 | A1 | 11/2003 | Mulder | |
| 2009/0179699 | A1 | 7/2009 | Higuchi | |
| 2015/0333534 | A1 * | 11/2015 | Liu ........................... | H02J 4/25 |
| | | | | 307/104 |
| 2018/0191267 | A1 * | 7/2018 | Keikhosravy ......... | H02M 7/219 |
| 2018/0287508 | A1 * | 10/2018 | Nakamura ............ | H02M 7/217 |
| 2021/0391804 | A1 * | 12/2021 | Salama ................... | H02M 1/08 |
| 2023/0223868 | A1 | 7/2023 | Rahmilov et al. | |
| 2024/0030829 | A1 * | 1/2024 | Al-Absi ................. | H02J 50/20 |

OTHER PUBLICATIONS

Xiaofei Li et al., "A VHF Wide-Input Range CMOS Passive Rectifier With Active Bias Tuning", IEEE Journal of Solid-State Circuits, vol. 55, No. 10, Oct. 2020, pp. 2629-2638.

Mahmoud H. Ouda et al., "Self-Biased Differential Rectifier With Enhanced Dynamic Range for Wireless Powering", IEEE Transactions on Circuits and Systems II: Express Briefs, vol. 64, No. 5, May 2017, pp. 515-519.

Abdullah S. Almansouri et al., "A CMOS RF-to-DC Power Converter With 86% Efficiency and −19.2-dBm Sensitivity", IEEE Transactions on Microwave Theory and Techniques, vol. 66, No. 5, May 2018, pp. 2409-2415.

Mahmoud H. Ouda et al., "Wide-Range Adaptive RF-to-DC Power Converter for UHF RFIDs", IEEE Microwave and Wireless Components Letters, vol. 26, No. 8, Aug. 2016 ,pp. 634-636.

Gabriel Chong et al., "A Wide-PCE-Dynamic-Range CMOS Cross-Coupled Differential-Drive Rectifier for Ambient RF Energy Harvesting", IEEE Transactions on Circuits and Systems II: Express Briefs, vol. 68, No. 6, Jun. 2021, pp. 1743-1747.

Xiaguang Li et al., "A Wide Input Range All-NMOS Rectifier With Gate Voltage Boosting Technique for Wireless Power Transfer", IEEE Transactions on Circuits and Systems II: Express Briefs, vol. 70, No. 11, Nov. 2023, pp. 4023-4027.

"Office Action of Taiwan Counterpart Application", issued on Sep. 18, 2025, p. 1-p. 4.

* cited by examiner

SIGNAL CONVERTER

BACKGROUND

Field of the Invention

The invention relates to a signal converter, and more particularly, to the signal converter for preventing unnecessary energy loss.

Description of Related Art

In conventional art, a rectifier may be constructed by cross-coupled transistor pairs for converting radio frequency input signal to a direct current (DC) voltage. For an application for an input signal with high power, reverse leakage current is generated in the conventional rectifier, and unnecessary energy loss may be occurred. For overcoming problem of the reverse leakage current, some conventional rectifier provides self-bias circuits. For avoiding current shunt from output end to input end of the rectifier, a diode or a feedback resistor with large on-resistance in the self-bias circuit is necessary, and the peak efficiency of the rectifier is reduced.

SUMMARY

The invention provides a signal converter which can reduce leakage current loss.

According to an embodiment of the invention, the signal converter includes a first capacitor, a second capacitor, a first switch to a fourth switch, and a first feedback control circuit to a fourth feedback control circuit. The first capacitor includes a first end coupled to a first input end for receiving a first input signal and a second end. The second capacitor includes a third end coupled to a second input end for receiving a second input signal and a fourth end. The first switch and second switch are coupled between a reference voltage end and an output end in series, the first switch and the second switch are coupled to the second end of the first capacitor, and are respectively controlled by a first feedback control signal and a second feedback control signal. The third switch and fourth switch are coupled between the reference voltage end and the output end in series. The third switch and fourth switch are coupled to the fourth end of the second capacitor, and are respectively controlled by a third feedback control signal and a fourth feedback control signal. The first feedback control circuit is coupled between the second input end and one of the third end and the fourth end of the second capacitor, for providing the first feedback control signal to a control end of the first switch. The second feedback control circuit is coupled between the first input end and one of the third end and the fourth end of the second capacitor, for providing the second feedback control signal to a control end of the second switch. The third feedback control circuit is coupled between the first input end and one of the first end and the second end of the first capacitor, for providing the third feedback control signal to a control end of the third switch. The fourth feedback control circuit is coupled between the second input end and one of the first end and the second end of the first capacitor, for providing the fourth feedback control signal to a control end of the fourth switch.

To sum up, the signal converter provides two cross-coupled rectifiers with a self-modulation scheme, and two feedback control paths for implementing self-control technology. By setting each of the feedback control paths to be coupled to radio frequency input ends, the leakage current loss can be reduced, and the efficiency of the signal converter can be enhanced correspondingly.

To make the above features and advantages of the invention more comprehensible, embodiments accompanied by drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
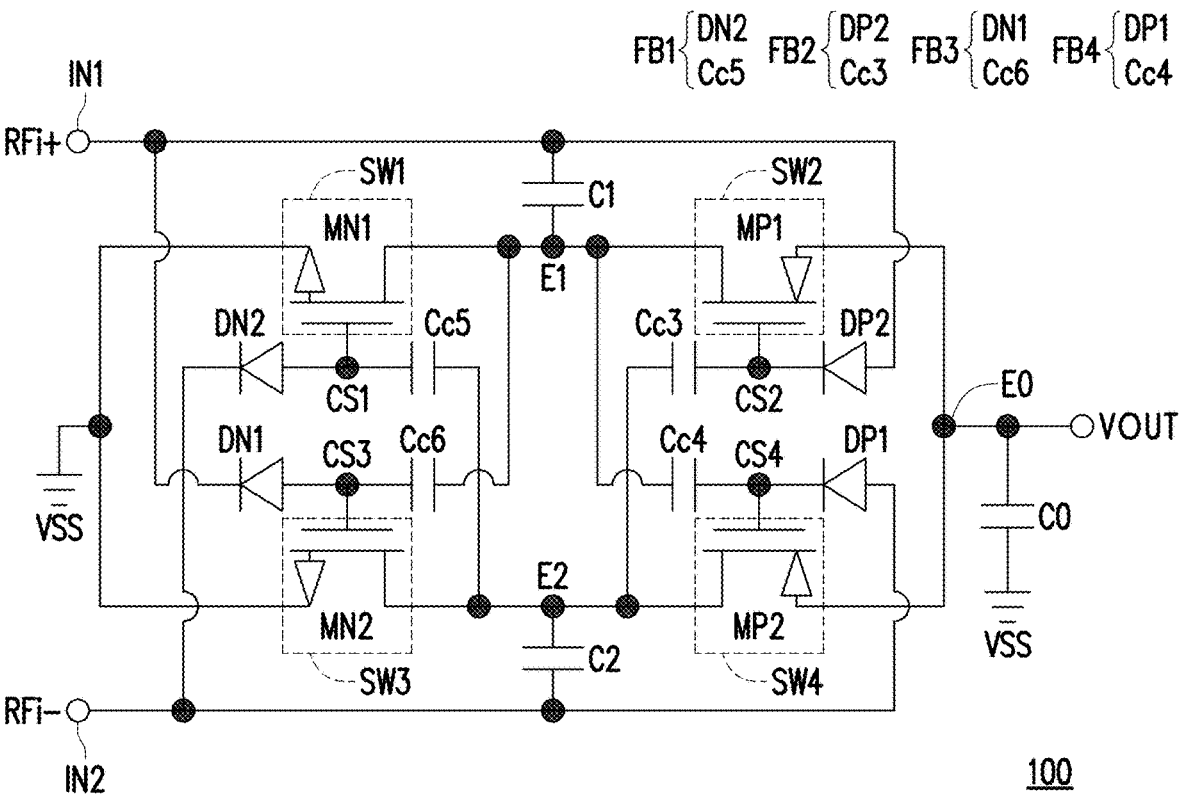
FIG. 1 illustrates a signal converter according to an embodiment of present disclosure.

The terms "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

Please refer to FIG. 1, which illustrates a signal converter according to an embodiment of present disclosure. The signal converter 100 includes switches SW1 to SW4, capacitors C1 and C2 and feedback control circuits FB1 to FB4. A first end of the capacitor C1 is coupled to an input end IN1 and a second end of the capacitor C1 is coupled to an end E1. A first end of the capacitor C2 is coupled to an input end IN2 and a second end of the capacitor C2 is coupled to an end E2. Hereinafter, the end E1 is also regarded as the second end of the capacitor C1 and the end E2 is also regarded as the second end of the capacitor C2. The switches SW1 and SW2 are coupled between a reference voltage end VSS and an output end E0 in series. The switches SW1 and SW2 are commonly coupled to the capacitor C1, and are respectively controlled by feedback control signals CS1 and CS2. The switches SW3 and SW4 are coupled between a reference voltage end VSS and an output end E0 in series. The switches SW3 and SW4 are commonly coupled to the capacitor C2, and are respectively controlled by feedback control signals CS3 and CS4. In this embodiment, the switches SW1 and SW2 are respectively formed by transistors MN1 and MP1, the switches SW3 and SW4 are respectively formed by transistors MN2 and MP2. In detail, the transistors MP1 and MP2 are P-type transistors, and the transistors MN1 and MN2 are N-type transistors. That is, a doping type of the transistor MP1 and a doping type of the transistor MN1 are complementary, and a doping type of the transistor MP2 and a doping type of the transistor MN2 are complementary.

The feedback control circuit FB1 is coupled between the input end IN2 and the end E2 (which is the second end of the capacitor C2) for providing a feedback control signal CS1 to a control end of the switch SW1. The feedback control circuit FB1 includes a diode DN2 and a capacitor Cc5 coupled in series. In this embodiment, a cathode of the diode DN2 is coupled to the input end IN2, an anode of the diode DN2 is coupled to one end of the capacitor Cc5 and the control end of the switch SW1, and the other end of the capacitor Cc5 is coupled to the end E2. A voltage signal at the coupling end of the diode DN2 and the capacitor Cc5 is used as the feedback control signal CS1.

The feedback control circuit FB2 is coupled between the input end IN1 and the end E2 for providing a feedback control signal CS2 to a control end of the switch SW2. The feedback control circuit FB2 includes a diode DP2 and a capacitor Cc3 coupled in series. In this embodiment, an anode of the diode DP2 is coupled to the input end IN1, a cathode of the diode DP2 is coupled to one end of the capacitor Cc3 and the control end of the switch SW2, and the other end of the capacitor Cc3 is coupled to the end E2. A voltage signal at a coupling end of the diode DP2 and the capacitor Cc3 is used as the feedback control signal CS2.

The feedback control circuit FB3 is coupled between the input end IN1 and the end E1 (which is the second end of the capacitor C1) for providing a feedback control signal CS3 to a control end of the switch SW3. The feedback control circuit FB3 includes a diode DN1 and a capacitor Cc6 coupled in series. In this embodiment, a cathode of the diode DN1 is coupled to the input end IN1, an anode of the diode DN1 is coupled to one end of the capacitor Cc6 and the control end of the switch SW3, and the other end of the capacitor Cc6 is coupled to the end E1. A voltage signal at the coupling end of the diode DN1 and the capacitor Cc6 is used as the feedback control signal CS3.

The feedback control circuit FB4 is coupled between the input end IN2 and the end E1 for providing a feedback control signal CS4 to a control end of the switch SW4. The feedback control circuit FB4 includes a diode DP1 and a capacitor Cc4 coupled in series. In this embodiment, an anode of the diode DP1 is coupled to the input end IN2, a cathode of the diode DP1 is coupled to one end of the capacitor Cc4 and the control end of the switch SW4, and the other end of the capacitor Cc4 is coupled to the end E1. A voltage signal at the coupling end of the diode DP1 and the capacitor Cc4 is used as the feedback control signal CS4.

The transistors MP1 and MP2 are connected to a cross-coupled transistor pair, and the transistors MN1 and MN2 are connected to a cross-coupled transistor pair.

In this embodiment, the input end IN1 is configured to receive a first input signal RFi+, and the input end IN2 is configured to receive a second input signal RFi−, where the first input signal RFi+ is different from the second input signal RFi−. In detail, the first input signal RFi+ and the second input signal RFi− are radio frequency signals, and the first input signal RFi+ and the second input signal RFi− are differential signals, and a phase of the first input signal RFi+ and a phase of the second input signal RFi− are complementary. Furthermore, the output end E0 is coupled to a capacitor C0, and the output end E0 is configured to generate an output signal VOUT. The signal converter 100 is configured to rectify the first and second input signals RFi+ and RFi− with AC (alternate current) format to generate the output signal VOUT with DC (direct current) format.

Figure 2:
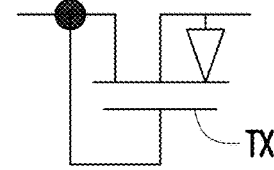
FIG. 2 illustrates a schematic diagram of a transistor connected in a diode connection configuration.

Please refer to FIG. 1 and FIG. 2, where FIG. 2 illustrates a schematic diagram of a transistor connected in a diode connection configuration. In FIG. 1, each of the diodes DN1 and DN2 may be formed by a transistor (such as a transistor Tx on FIG. 2) connected in a diode connection configuration, and the type of the transistor is not limited in the present disclosure. In FIG. 2, the transistor Tx may be a P-type transistor, a control end (gate terminal) and a first end (drain terminal) of the transistor Tx are connected together to form a cathode of the diode, and a second end (source terminal) connected to the body of the transistor Tx may form an anode of the diode. In FIG. 1, each of the diodes DP1 and DP2 may be formed by a transistor connected in another diode connection configuration different from that in FIG. 2. Diodes DP1 and DP2 may have an anode formed by a source terminal of a P-type transistor and a cathode formed by a drain terminal connected to a body of the P-type transistor connected to a gate terminal of the P-type transistor.

Of course, each of the diodes DP1, DP2, DN1, and DN2 may also be formed by an N-type transistor with a diode connection configuration.

On the other hand, each of the capacitors Cc3 to Cc6 may be a metal-insulator-metal capacitor, a metal-oxide-metal capacitor, or a metal-oxide-semiconductor capacitor.

Please refer to FIG. 3A to FIG. 3D, which illustrate schematic diagrams of operation of the signal converter according to an embodiment of present disclosure. In FIG. 3A to FIG. 3D, the signal converter 100 here has the same circuit structure as the signal converter 100 in FIG. 1, and no more repeated description here. In these embodiments, the first and second input signals RFi+ and RFi− may be sine wave signals with complementary phases. In the following descriptions of FIG. 3A and FIG. 3B, only an operation of the feedback control circuit FB2, including the diode DP2, the capacitor Cc3, and the corresponding transistor MP1 are discussed. In the following descriptions of FIG. 3C and FIG. 3D, only an operation of the feedback control circuit FB4, including the diode DP1, the capacitor Cc4, and the corresponding transistor MP2 are discussed.

Figure 3A:
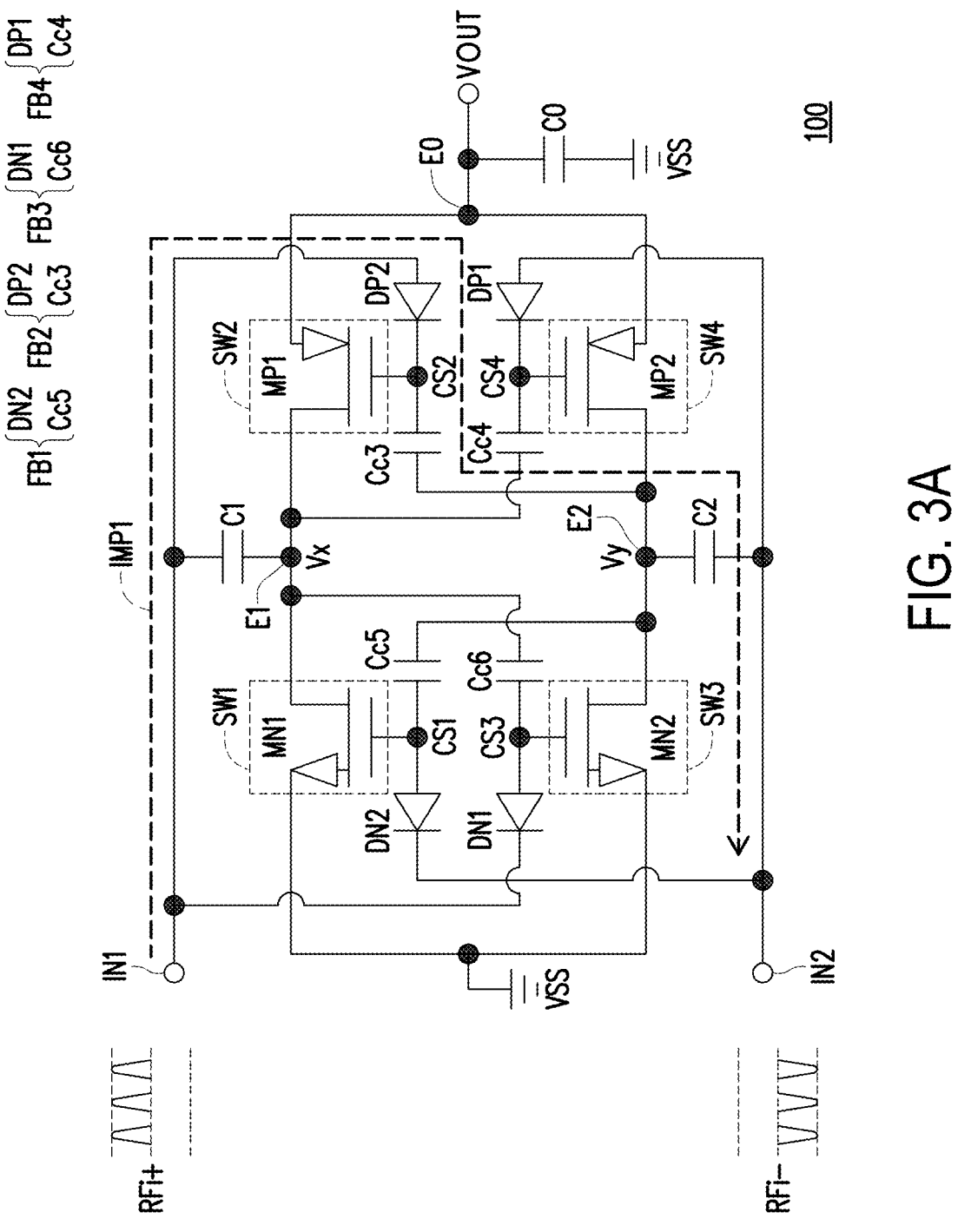
FIG. 3A to FIG. 3D illustrate schematic diagrams of operation of the signal converter according to an embodiment of present disclosure.

FIG. 3A depicts the operation of the transistor MP1 and the feedback control circuit FB2 during a positive half-cycle of the first input signal RFi+ in the transient state (and at the same time the second input signal RFi− is in a negative half-cycle). During the positive half-cycle of the first input signal RFi+, the diode DP2 may be activated when a voltage of the first input signal RFi+ reaches a level higher than a summation of the voltage of the feedback control signal CS2 and the cut-off voltage of the diode DP2. Such as that, a current IMP1 may be generated flowing from the input end IN1 through a feedback control path forming by the diode DP2, the capacitor Cc3, and the capacitor C2, to the input end IN2, and the capacitors Cc3 and C2 may be charged by the current IMP1. That is, the feedback control signal CS2, which is the voltage signal at a gate terminal of the transistor MP1, may be charged to a first voltage, and a voltage Vy on the end E2 may be charged to a second voltage, where the first voltage is larger than the second voltage. Additionally, the transistor MP1 may be turned on to transport current to the output end E0 to charge the capacitor C0 for generating the output voltage VOUT with direct current (DC) voltage.

Figure 3B:
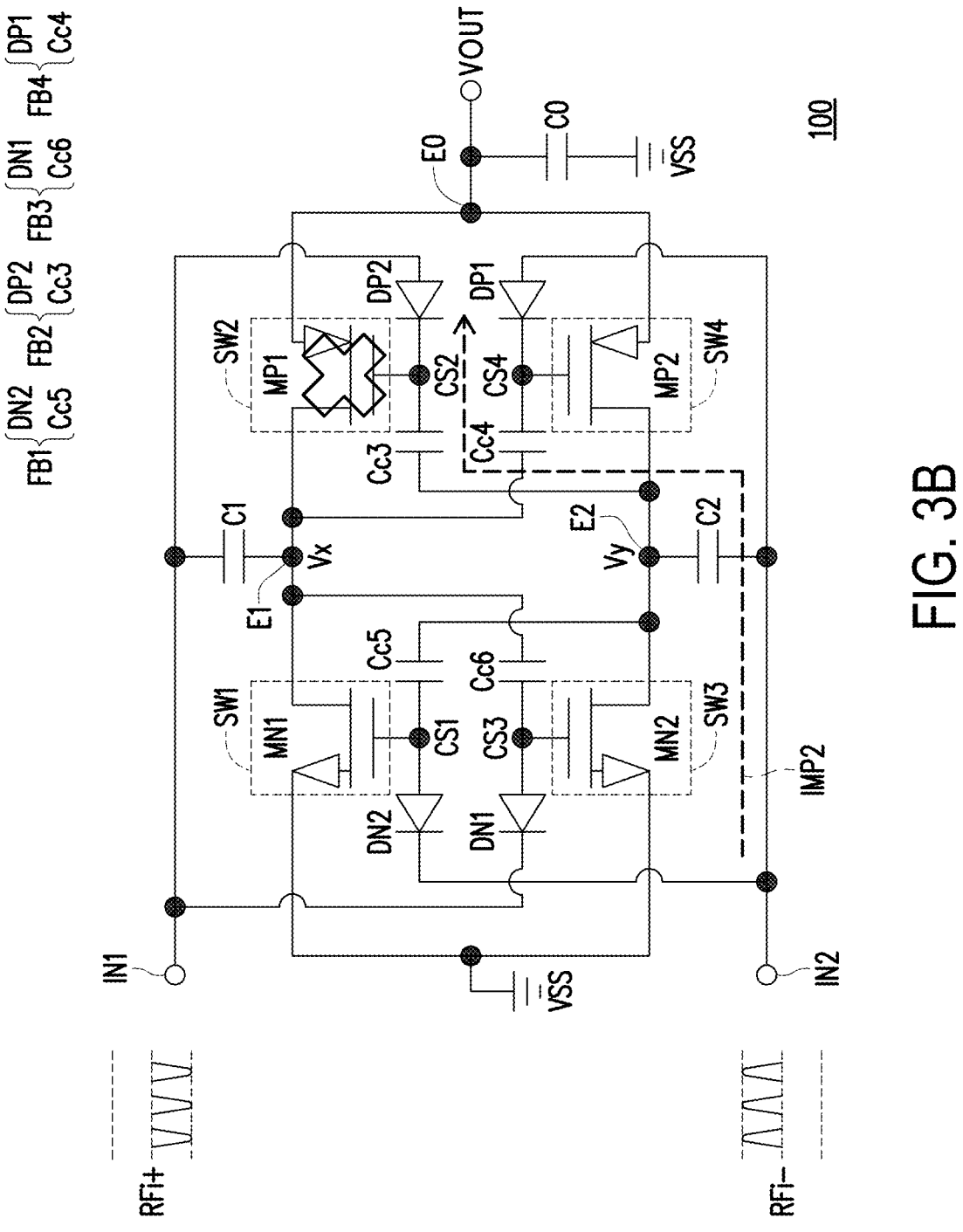

FIG. 3B depicts the operation of the transistor MP1 and the feedback control circuit FB2 during a negative half-cycle of the first input signal RFi+ in the transient state (and at the same time the second input signal RFi– is in a positive half-cycle). Please refer to FIG. 3B, a current IMP2 from the input end IN2 to the gate terminal of the transistor MP1 through the capacitors C2 and Cc3. Since the voltage of the second input signal RFi– is gradually raised, the voltage of the feedback control signal CS2 and the voltage Vy on the end E2 are boosted up at the same time. Such as that, the transistor MP1 may be completely cut-off when the voltage of the feedback control signal CS2 is boosted up to a certain voltage. Additionally, the transistor MP1 is cut off to prevent reverse leakage current from the charge in capacitor C0 to the voltage Vx on the end E1 through the transistor MP1.

Figure 3C:
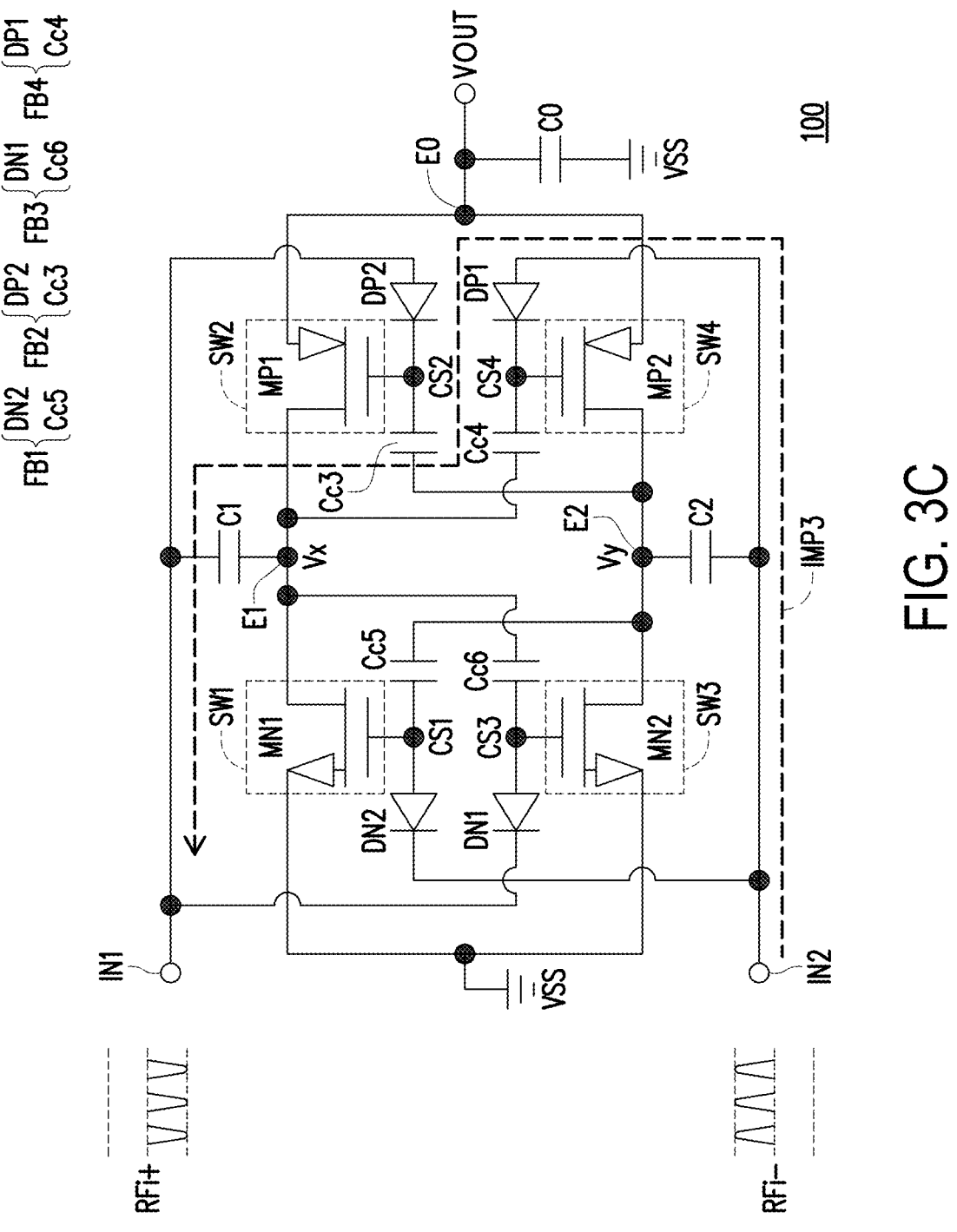
Figure 3D:
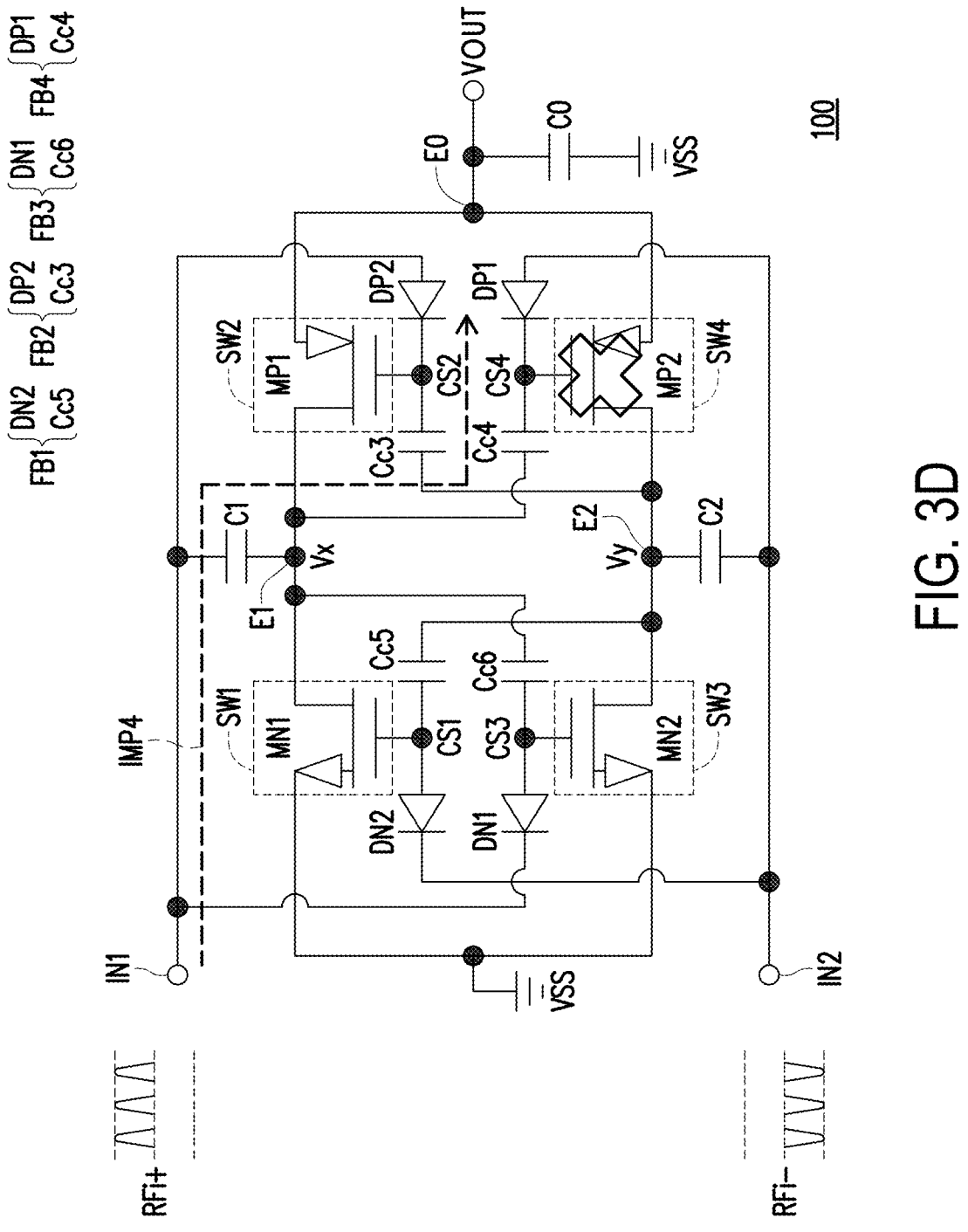

The operation of the feedback control circuit FB4, including the diode DP1, the capacitor Cc4, and the corresponding transistor MP2 in FIG. 3C and FIG. 3D, which are similar to the operation discussed in FIG. 3A and FIG. 3B. FIG. 3C depicts the operation of the transistor MP2 and the feedback control circuit FB4 during the negative half-cycle of the first input signal RFi+ in the transient state (and at the same time the second input signal RFi– is in a positive half-cycle). During the negative half-cycle of the first input signal RFi+, the diode DP1 may be activated when a voltage of the second input signal RFi– reaches a level higher than a summation of the voltage of the feedback control signal CS4 and the cut-off voltage of the diode DP1. Such as that, a current IMP3 may be generated flowing from the input end IN2 through a feedback control path forming by the diode DP1, the capacitor Cc4, and the capacitor C1 to the input end IN1, and the capacitors Cc4 and C1 may be charged by the current IMP3. That is, the feedback control signal CS4, which is the voltage signal at the gate terminal of the transistor MP2, may be charged to a first voltage, and a voltage Vx on the end E1 may be charged to a second voltage, where the first voltage is larger than the second voltage. Additionally, the transistor MP2 may be turned on to transport current to the output end E0 to charge the capacitor C0 for generating the output voltage VOUT with direct current (DC) voltage.

FIG. 3D depicts the operation of the transistor MP2 and the feedback control circuit FB4 during the positive half-cycle of the first input signal RFi+ in the transient state (and at the same time the second input signal RFi– is in a negative half-cycle). Please refer to FIG. 3D, a current IMP4 from the input end IN1 to CS4 through the capacitors C1 and Cc4. Since the voltage of the first input signal RFi+ is gradually raised, the voltage of the feedback control signal CS4 and the voltage Vx on the end E1 are boosted up at the same time. Such as that, the transistor MP2 may be completely cut-off when the voltage of the feedback control signal CS4 is boosted up to a certain voltage. Additionally, the transistor MP2 is cut off to prevent reverse leakage current from the charge in capacitor C0 to the voltage Vy on the end E2 through the transistor MP2.

Figure 4:
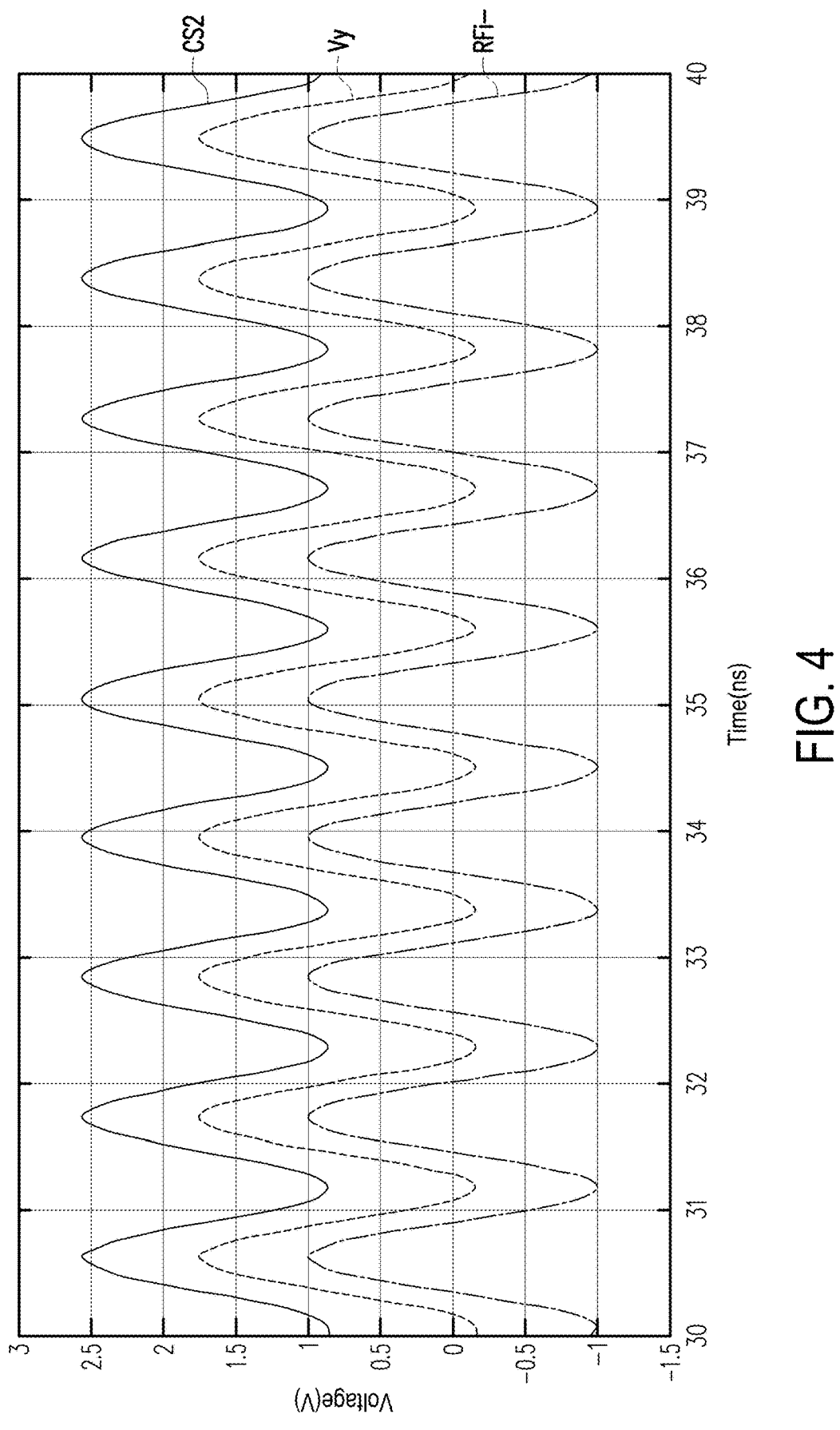
FIG. 4 illustrates a waveform plot of signal converter in the steady state according to an embodiment of present disclosure.

Please refer to FIG. 4, FIG. 3A and FIG. 3B commonly, wherein FIG. 4 illustrates a waveform plot of signal converter in a steady state according to an embodiment of present disclosure. In the steady state, the second input signal RFi– is a stable sine wave, the voltage Vy on the end E2 is a stable sine wave, and the feedback control signal CS2 is also a stable sine wave. In this embodiment, a DC level of the feedback control signal CS2 is larger than a DC level of the voltage Vy, and the DC level of the voltage Vy is larger than a DC level of the second input signal RFi–. Amplitudes of the second input signal RFi–, the voltage Vy, and the feedback control signal CS2 are substantially the same. In this embodiment, therefore, the reverse leakage loss of the transistor MP1 can be effectively reduced by enhancing the DC level of the feedback control signal CS2 through the feedback control circuit FB2. Additionally, the feedback control signal CS2 is always higher than the first input signal RFi+ (which opposes to RFi–), ensuring that the diode DP2 remains deactivated in the steady state to prevent unnecessary energy loss.

Please refer to FIG. 5A to FIG. 5D, which illustrate schematic diagrams of operation of the signal converter according to an embodiment of present disclosure. In FIG. 5A to FIG. 5D, the signal converter 100 here has same circuit structure as the signal converter 100 in FIG. 1, and no more repeated description here. In the following descriptions of FIG. 5A and FIG. 5B, only an operation of the feedback control circuit FB3, including the diode DN1, the capacitor Cc6, and the corresponding transistor MN2 are discussed. In the following descriptions of FIG. 5C and FIG. 5D, only an operation of the feedback control circuit FB1, including the diode DN2, the capacitor Cc5, and the corresponding transistor MN1 are discussed.

Figure 5A:
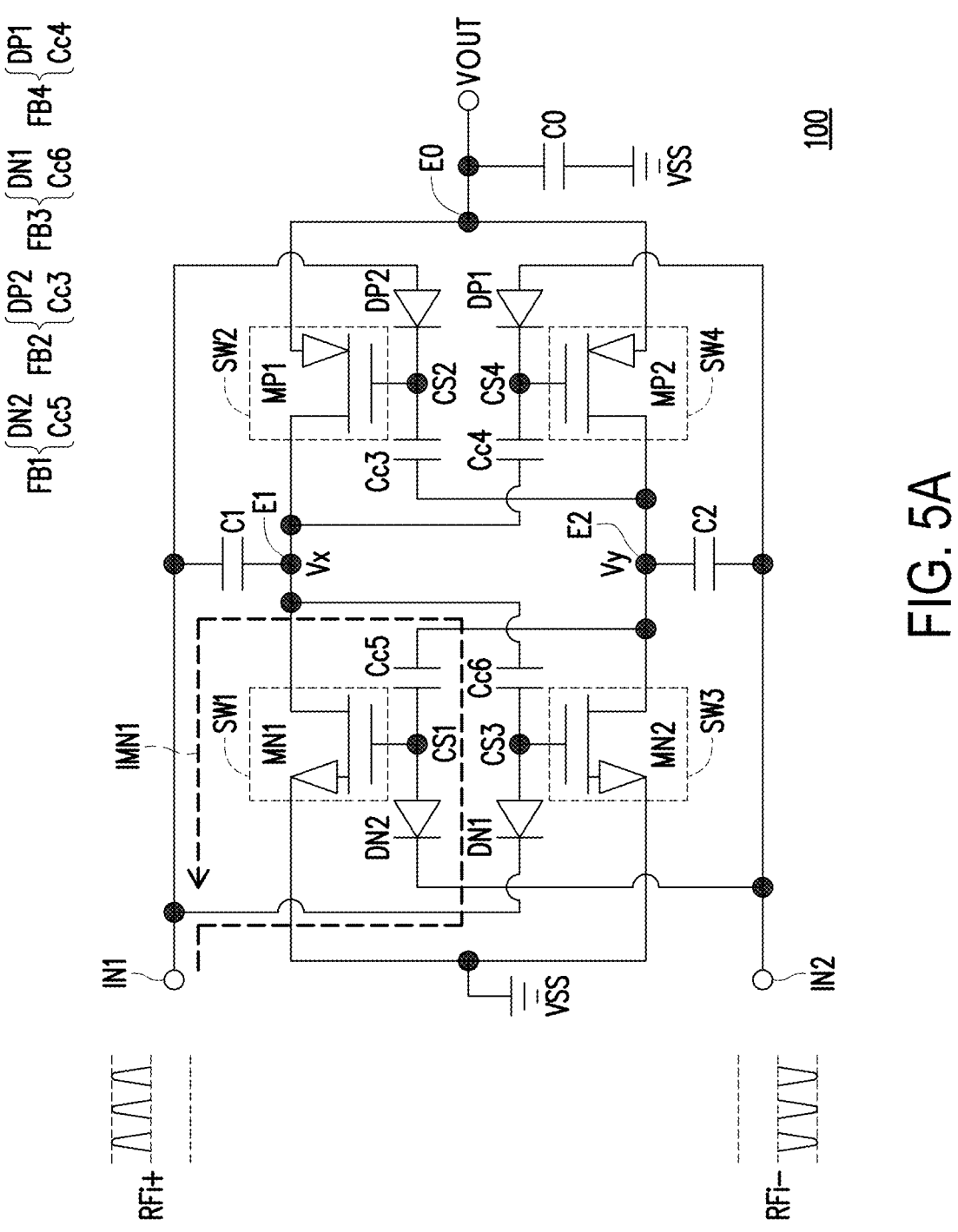
FIG. 5A to FIG. 5D illustrate schematic diagrams of operation of the signal converter according to an embodiment of present disclosure.

FIG. 5A depicts the operation of the transistor MN2 and the feedback control circuit FB3 during the positive half-cycle of the first input signal RFi+ in the transient state (and at the same time the second input signal RFi– is in the negative half-cycle). During the positive half-cycle of the first input signal RFi+ in the transient state, a voltage of the first input signal RFi+ may be slightly larger than a summation of a voltage of the feedback control signal CS3 and a cut-off voltage of the diode DN1. Such as that, the diode DN1 may be deactivated. However, a reverse current IMN1 may be generated flowing from the input end IN1 through a feedback control path forming by the diode DN1, the capacitor Cc6, and the capacitor C1, to the input end IN1, and the capacitors Cc6 and C1 may be slightly charged by the current IMP3. Additionally, the transistor MN2 is turned on to charge the capacitor C2 from a reference voltage end VSS to the input end IN2 through the transistor MN2.

Figure 5B:
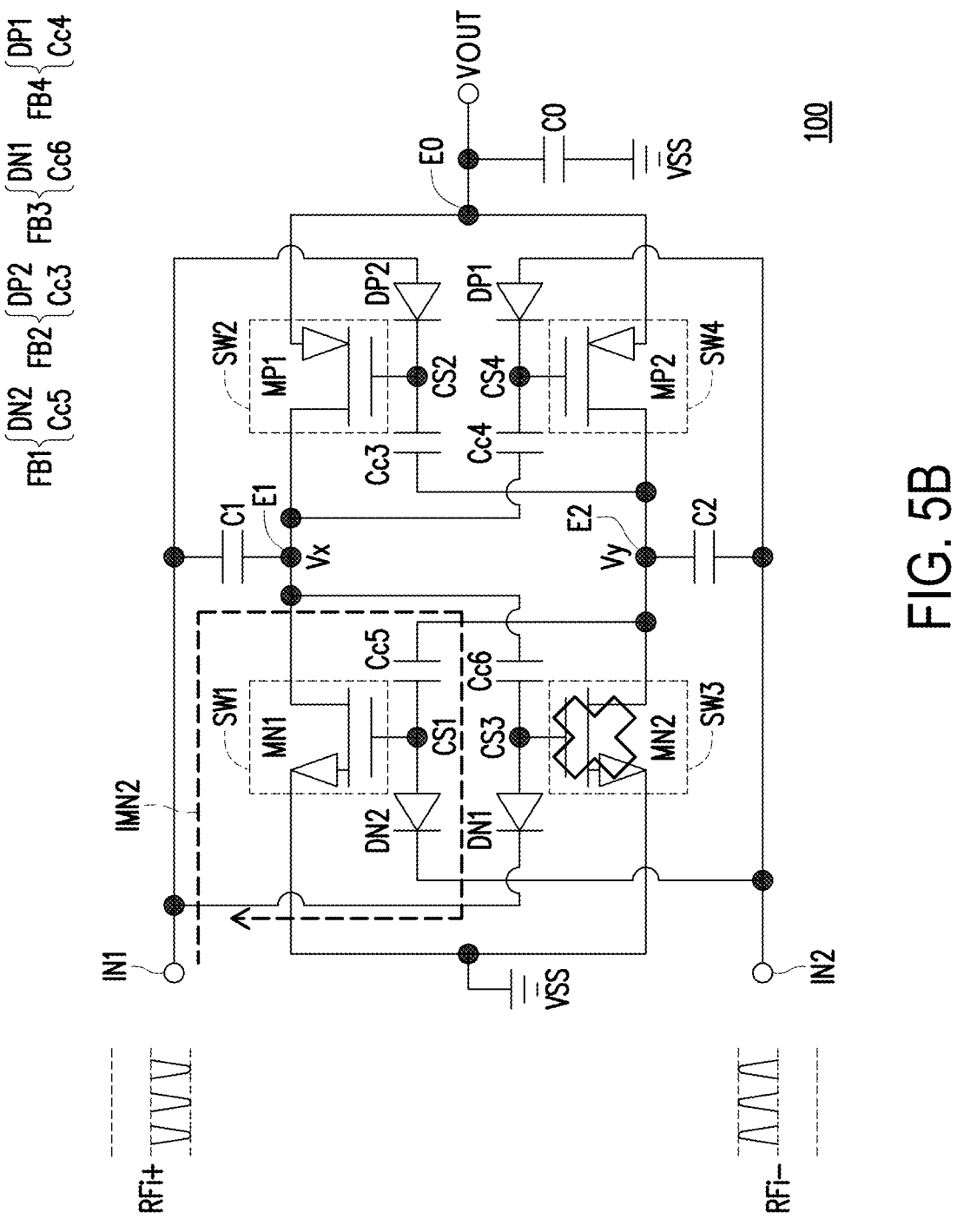

FIG. 5B depicts the operation of the transistor MN2 and the feedback control circuit FB3 during the negative half-cycle of the first input signal RFi+ in the transient state (and at the same time the second input signal RFi– is in the positive half-cycle). The voltage of the feedback control signal CS3 and voltage of a voltage Vx at the end E1 may be raised during the transient state. However, the voltage of the feedback control signal CS3 is greater than a summation of the voltage of the input end IN1 and a cut-off voltage of the diode DN1 after a few cycles, resulting in the diode DN1 being turned on, causing the voltage of the feedback control signal CS3 to discharge energy through the diode DN1 to the input end IN1.

Figure 5C:
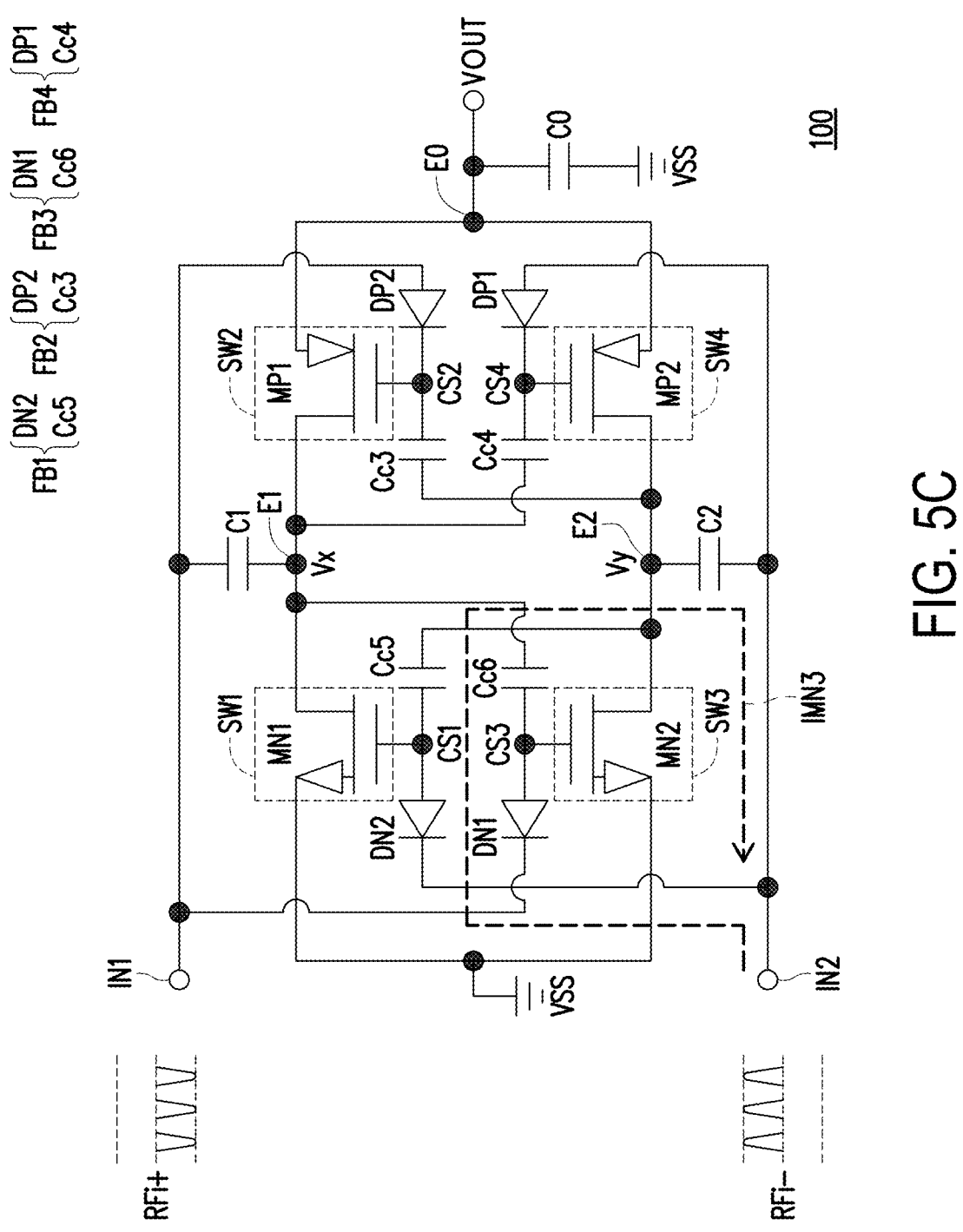
Figure 5D:
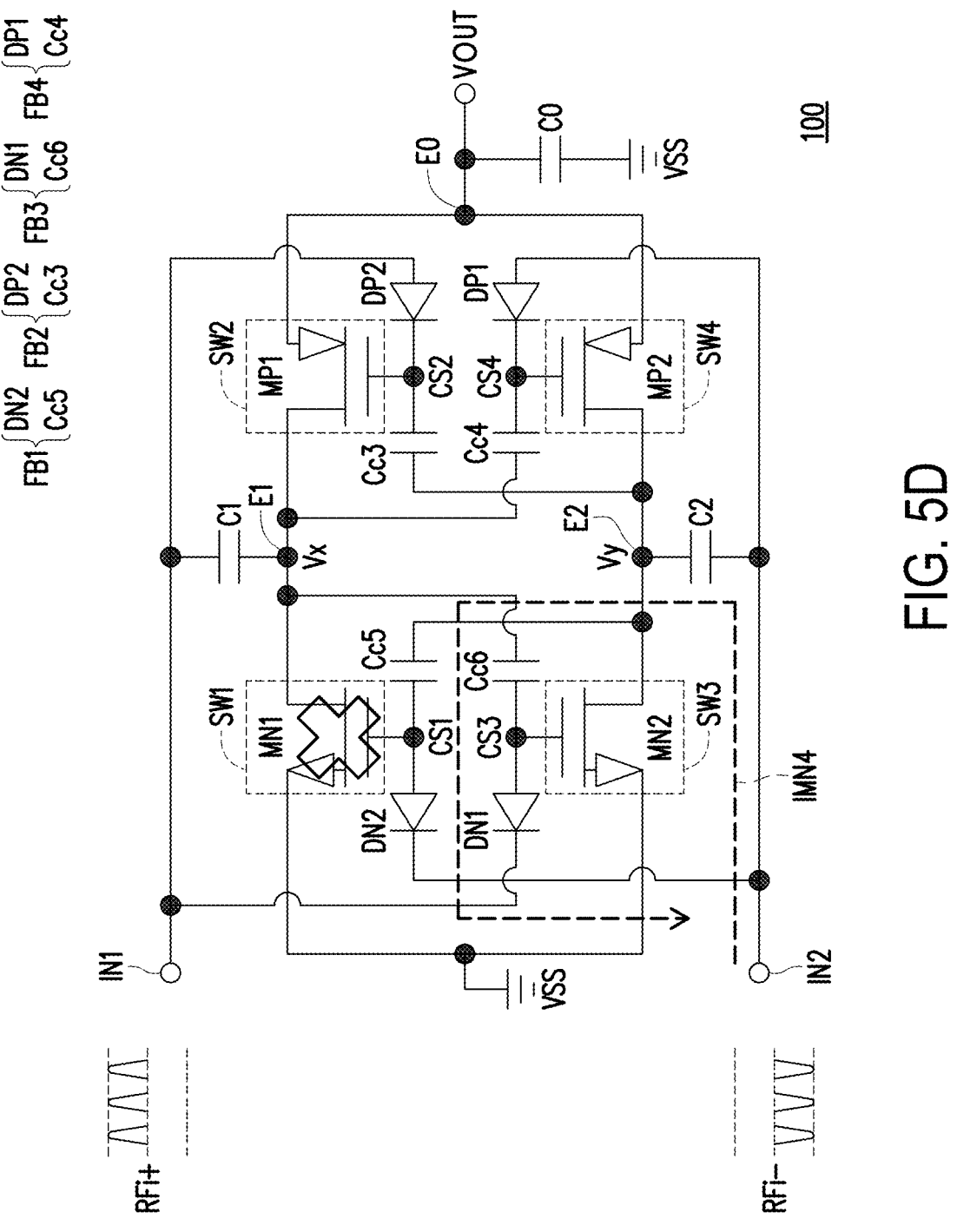

The operation of the feedback control circuit FB1, including the diode DN2, the capacitor Cc5, and the corresponding transistor MN1 in FIG. 5C and FIG. 5D, which are similar to the operation discussed in FIG. 5A and FIG. 5B. FIG. 5C depicts the operation of the transistor MN1 and the feedback control circuit FB1 during the negative half-cycle of the first input signal RFi+ in the transient state (and at the same time the second input signal RFi– is in the positive half-cycle). During the positive half-cycle of the second input signal RFi– in the transient state, a voltage of the second input signal RFi– may be slightly larger than a summation of a voltage of the feedback control signal CS1 and a cut-off voltage of the diode DN2. Such as that, the diode DN2 may be deactivated. However, a reverse current IMN3 may be generated flowing from the input end IN2 through a feedback control path forming by the diode DN2, the capacitor Cc5, and the capacitor C2, to the input end IN2, and the capacitors Cc5 and C2 may be slightly charged by the current IMN3. Additionally, the transistor MN1 is turned on to charge the capacitor C1 from a reference voltage end VSS to the input end IN1 through the transistor MN1.

FIG. 5D depicts the operation of the transistor MN1 and the feedback control circuit FB1 during the positive half-cycle of the first input signal RFi+ in the transient state (and at the same time the second input signal RFi– is in the negative half-cycle). The voltage of the feedback control signal CS1 and voltage of a voltage Vy at the end E2 may be raised during the transient state. However, the voltage of the feedback control signal CS1 is greater than a summation of the voltage of the input end IN2 and a cut-off voltage of the diode DN2 after a few cycles, resulting in the diode DN2 being turned on, causing the voltage of the feedback control signal CS1 to discharge energy through the diode DN2 to the input end IN2.

Figure 6:
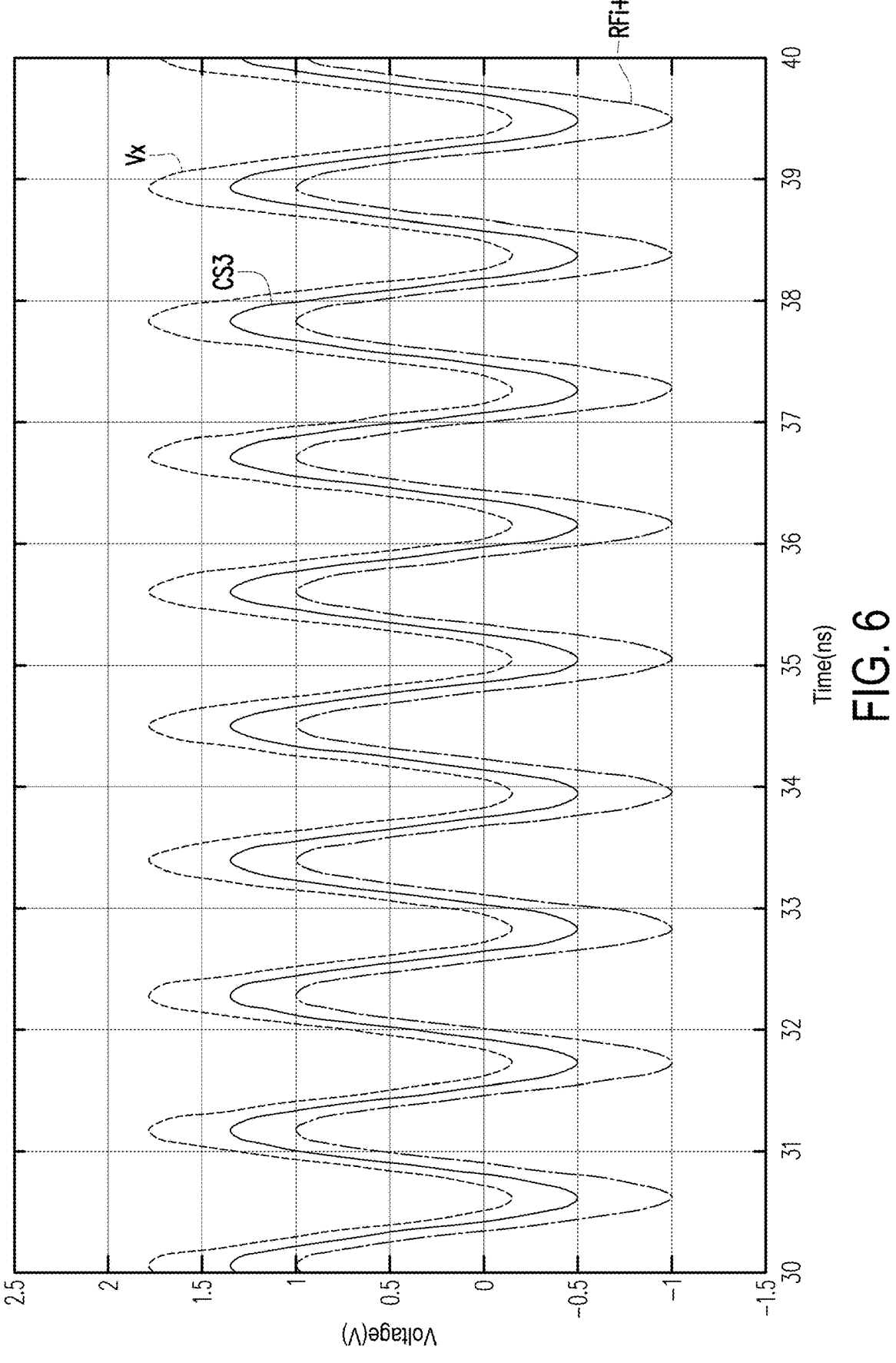
FIG. 6 illustrates a waveform plot of signal converter in the steady state according to an embodiment of present disclosure.

Please refer to FIG. 6, FIG. 5A and FIG. 5B commonly, wherein FIG. 6 illustrates a waveform plot of signal converter in the steady state according to an embodiment of present disclosure. In the steady state, the first input signal RFi+ is a stable sine wave, the voltage Vx on the end E1 is a stable sine wave, and the feedback control signal CS3 is also a stable sine wave. In this embodiment, a DC level of the feedback control signal CS3 is less than a DC level of the voltage Vx, and the DC level of the feedback control signal CS3 is slightly larger than a DC level of the first input signal RFi+. Amplitudes of the first input signal RFi+, the voltage Vx, and the feedback control signal CS3 are substantially the same. In this embodiment, therefore, the reverse leakage loss of the transistor MN2 can be effectively reduced by declining the DC level of the feedback control signal CS3 through the feedback control circuit FB3. Additionally, a voltage of the first input signal RFi+ may be slightly higher than a summation of a voltage of the feedback control signal CS3 and a cut-off voltage of the diode DN1, ensuring that the diode DN1 remains deactivated in the steady state to prevent unnecessary energy loss.

Figure 7A:
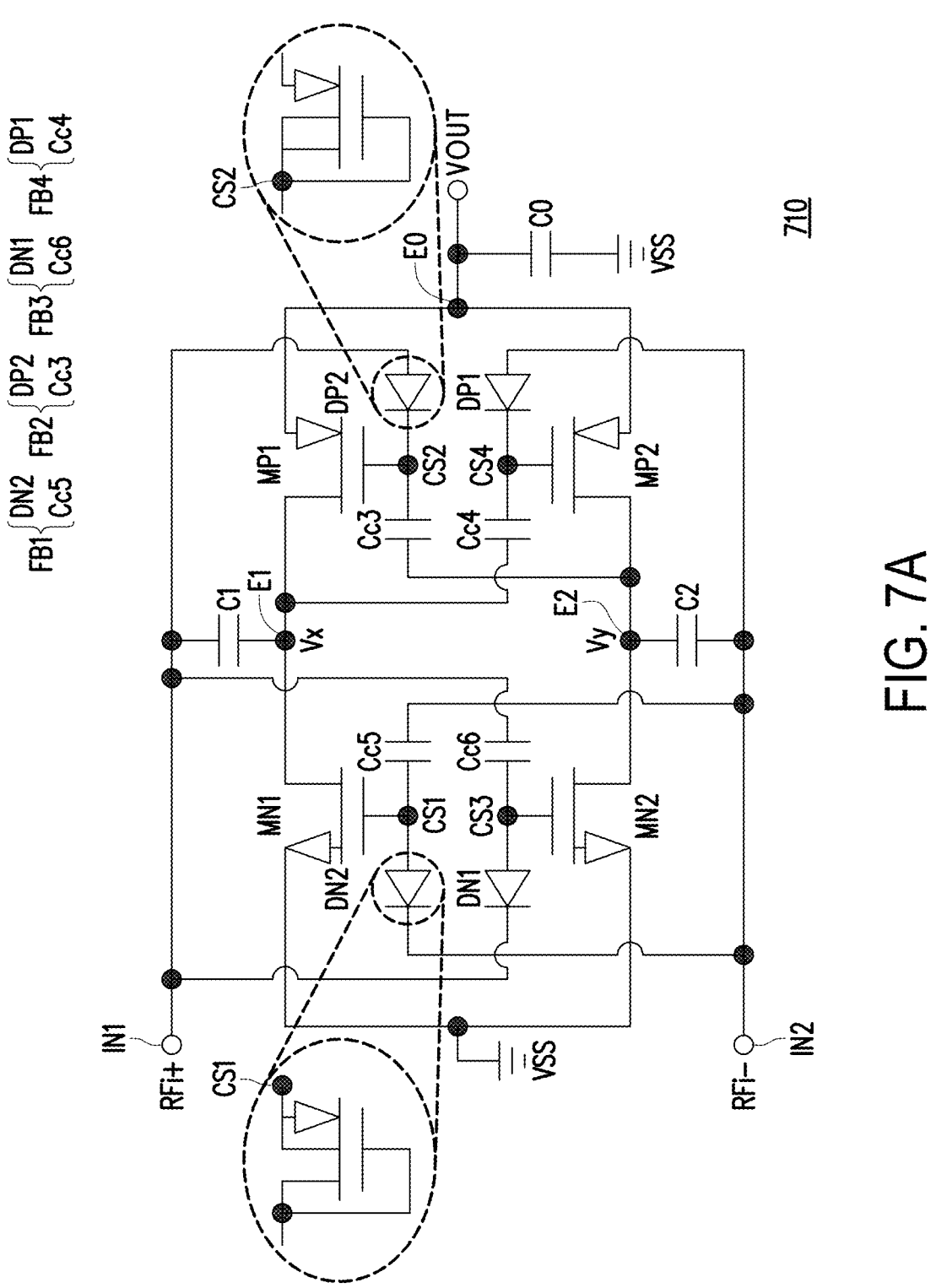
FIG. 7A to FIG. 7C illustrate a plurality of signal converters according to different embodiments of present disclosure.
Figure 7B:
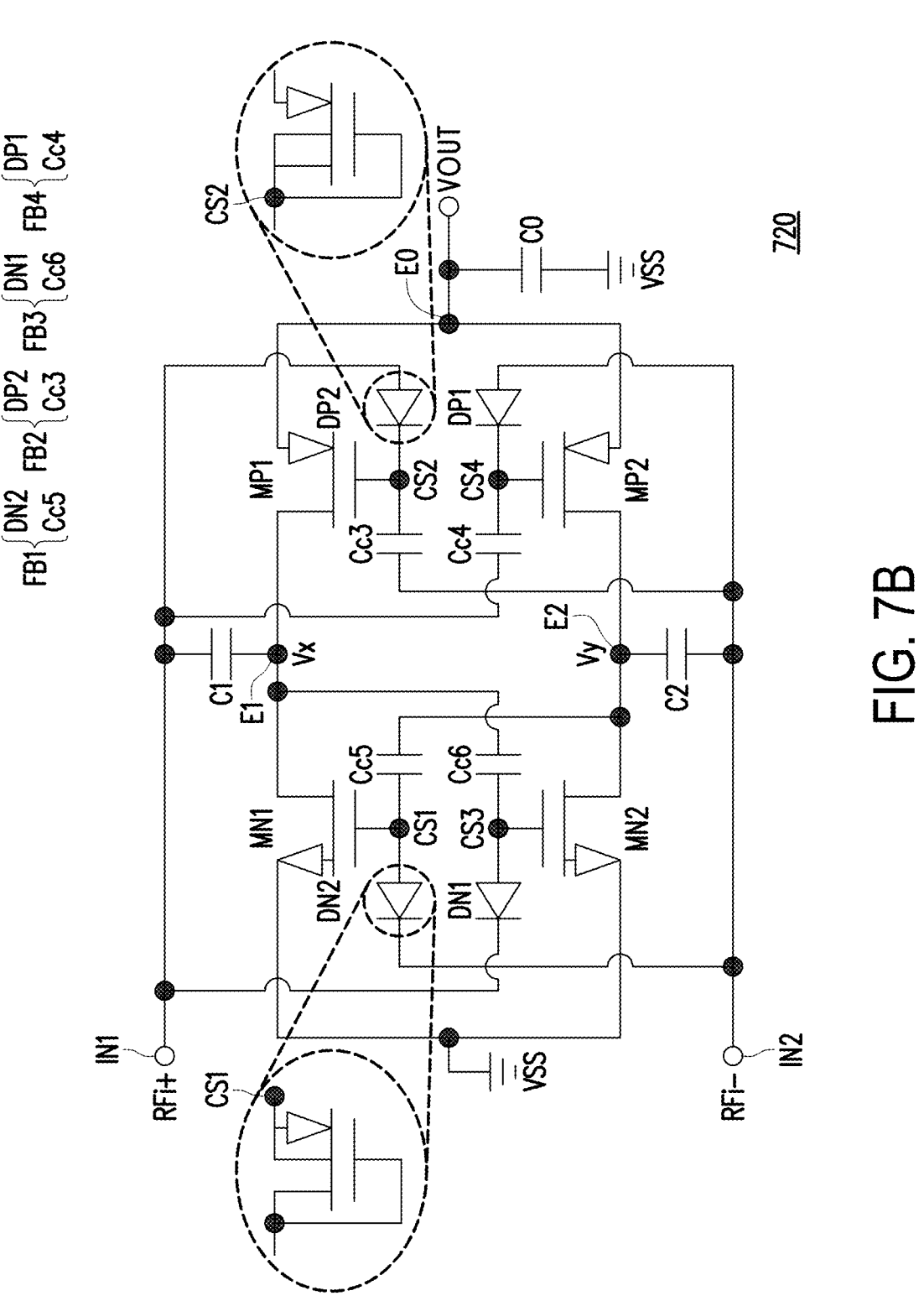
Figure 7C:
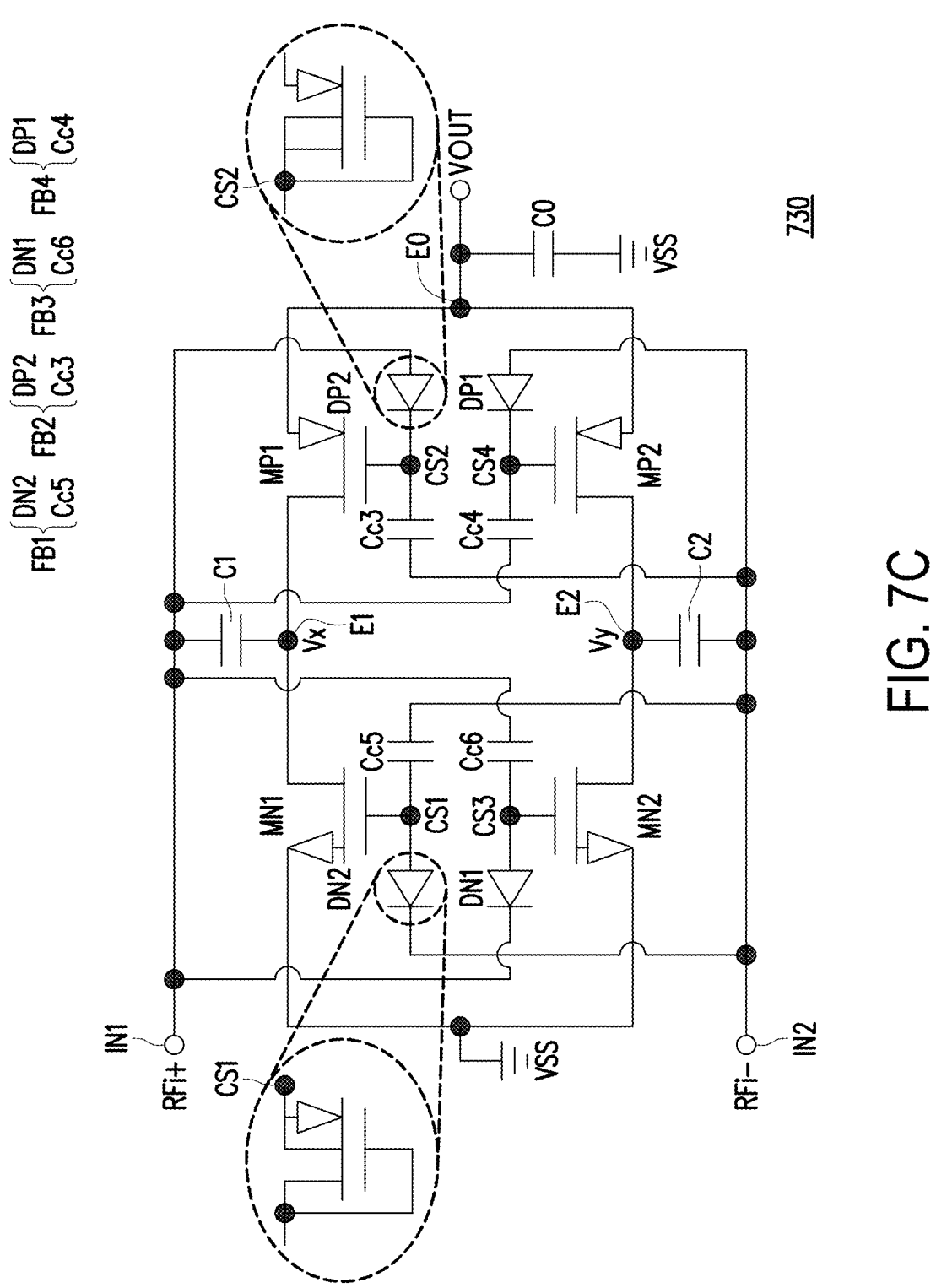

Please refer FIG. 7A to FIG. 7C, which illustrate a plurality of signal converters according to different embodiments of present disclosure. In FIG. 7A, the signal converter 710 includes transistors MN1, MN2, MP1, MP2, capacitors C0, C1, C2, Cc3 to Cc6 and diodes DN1, DN2, DP1, and DP2. The diode DN2 and the capacitor Cc5 form a feedback control circuit FB1; the diode DP2 and the capacitor Cc3 form a feedback control circuit FB2; the diode DN1 and the capacitor Cc6 form a feedback control circuit FB3; and the diode DP1 and the capacitor Cc4 form a feedback control circuit FB4. Each of the diodes DN1, DN2, DP1, and DP2 may be formed by a transistor connected in a diode connection configuration.

In this embodiment, a circuit structure of the signal converter 710 is similar to a circuit structure of the signal converter 100, and the same part is not repeat described here. Different from the signal converter 100, in the signal converter 710, two ends of the feedback control circuit FB1 are directly coupled to the input end IN2, and two ends of the feedback control circuit FB3 are directly coupled to the input end IN1. That is, in the feedback control circuit FB1, the capacitor Cc5 has a first end coupled to an anode of the diode DN2, a cathode of the diode DN2 is directly coupled to the input end IN2, and a second end of the capacitor Cc5 is directly coupled to the input end IN2. Also, in the feedback control circuit FB3, the capacitor Cc6 has a first end coupled to an anode of the diode DN1, a cathode of the diode DN1 is directly coupled to the input end IN1, and a second end of the capacitor Cc6 is directly coupled to the input end IN1.

Please refer to FIG. 7B, the circuit structure of the signal converter 720 is also similar to a circuit structure of the signal converter 100, and the same part is not repeat described here. Different from the signal converter 100, in the signal converter 720, one end of the feedback control circuit FB2 are directly coupled to the input end IN1, and the other end of the feedback control circuit FB2 are directly coupled to the input end IN2; one end of the feedback control circuit FB4 are directly coupled to the input end IN2, and the other end of the feedback control circuit FB4 are directly coupled to the input end IN1.

That is, in the feedback control circuit FB2, an anode of the diode DP2 is directly coupled to the input end IN1, a cathode of the diode DP2 is coupled to the first end of the capacitor Cc3, and a second end of the capacitor Cc3 is directly coupled to the input end IN2. Also, in the feedback control circuit FB4, an anode of the diode DP1 is directly coupled to the input end IN2, a cathode of the diode DP1 is coupled to the first end of the capacitor Cc4, and a second end of the capacitor Cc4 is directly coupled to the input end IN1.

Please refer to FIG. 7C, the circuit structure of the signal converter 730 is also similar to a circuit structure of the signal converter 100, and the same part is not repeat described here. Different from the signal converter 100, in the signal converter 730, two ends of the feedback control circuit FB1 are directly coupled to the input end IN2, and two ends of the feedback control circuit FB3 are directly coupled to the input end IN1. Furthermore, in the signal converter 730, one end of the feedback control circuit FB2 are directly coupled to the input end IN1, and the other end of the feedback control circuit FB2 are directly coupled to the input end IN2; one end of the feedback control circuit FB4 are directly coupled to the input end IN2, and the other end of the feedback control circuit FB4 are directly coupled to the input end IN1.

That is, in the feedback control circuit FB1, the capacitor Cc5 has a first end coupled to an anode of the diode DN2, a cathode of the diode DN2 is directly coupled to the input end IN2, and a second end of the capacitor Cc5 is directly coupled to the input end IN2. In the feedback control circuit FB3, the capacitor Cc6 has a first end coupled to an anode of the diode DN1, a cathode of the diode DN1 is directly coupled to the input end IN1, and a second end of the capacitor Cc6 is directly coupled to the input end IN1. In the feedback control circuit FB2, an anode of the diode DP2 is directly coupled to the input end IN1, a cathode of the diode DP2 is coupled to a first end of the capacitor Cc3, and a second end of the capacitor Cc3 is directly coupled to the input end IN2. Also, in the feedback control circuit FB4, an anode of the diode DP1 is directly coupled to the input end IN2, a cathode of the diode DP1 is coupled to a first end of the capacitor Cc4, and a second end of the capacitor Cc4 is directly coupled to the input end IN1.

In summary, in preset embodiments, the signal converter provides a plurality of feedback control circuits, and each of the feedback control circuits is coupled to corresponding switch. The feedback control circuits respectively provide control signals to the switches for controlling turned on or cut-off states of the switches. Furthermore, by operations of the feedback control circuits, leakage current loss of the signal converter can be reduced, and an efficiency of the signal converter can be enhanced correspondingly.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A signal converter, comprising:
a first capacitor comprising a first end coupled to a first input end receiving a first input signal and a second end;
a second capacitor comprising a third end coupled to a second input end receiving a second input signal and a fourth end;
a first switch and a second switch, coupled between a reference voltage end and an output end in series, the first switch and the second switch being coupled to the second end of the first capacitor, and being respectively controlled by a first feedback control signal and a second feedback control signal;
a third switch and a fourth switch, coupled between the reference voltage end and the output end in series, the third switch and fourth switch being coupled to the fourth end of the second capacitor, and being respectively controlled by a third feedback control signal and a fourth feedback control signal;
a first feedback control circuit, coupled between the second input end and one of the third end and the fourth end of the second capacitor, for providing the first feedback control signal to a control end of the first switch;
a second feedback control circuit, coupled between the first input end and one of the third end and the fourth end of the second capacitor, for providing the second feedback control signal to a control end of the second switch;
a third feedback control circuit, coupled between the first input end and one of the first end and the second end of the first capacitor, for providing the third feedback control signal to a control end of the third switch; and
a fourth feedback control circuit, coupled between the second input end and one of the first end and the second end of the first capacitor, for providing the fourth feedback control signal to a control end of the fourth switch.

2. The signal converter as claimed in claim 1, wherein the first input signal and the second input signal are differential radio-frequency signals and the output end outputs a direct current output voltage.

3. The signal converter as claimed in claim 1, wherein each of the first to fourth feedback control circuits comprises a diode and a capacitor which are coupled in series.

4. The signal converter as claimed in claim 3, wherein the diode is formed by a transistor connecting in diode connection configuration.

5. The signal converter as claimed in claim 4, wherein the transistor is a P-type transistor.

6. The signal converter as claimed in claim 3, wherein the capacitor is a metal-insulator-metal capacitor, a metal-oxide-metal capacitor, or a metal-oxide-semiconductor capacitor.

7. The signal converter as claimed in claim 1, wherein the first feedback control circuit comprises:
a diode, comprising an anode coupled to the control end of the first switch and a cathode coupled to the second input end; and
a third capacitor, comprising one end coupled to the control end of the first switch and the anode of the diode and the other end coupled to either the third end of the second capacitor or the fourth end of the second capacitor.

8. The signal converter as claimed in claim 1, wherein the second feedback control circuit comprises:
a diode, comprising an anode coupled to the first input end and a cathode coupled to the control end of the second switch; and
a third capacitor, comprising one end coupled to the control end of the second switch and the cathode of the diode and the other end coupled to either the third end of the second capacitor or the fourth end of the second capacitor.

9. The signal converter as claimed in claim 1, wherein the third feedback control circuit comprises:
a diode, comprising an anode coupled to the control end of the third switch and a cathode coupled to the first input node; and
a third capacitor, comprising one end coupled to the control end of the third switch and the anode of the diode and the other end coupled to either the first end of the first capacitor or the second end of the first capacitor.

10. The signal converter as claimed in claim 1, wherein the fourth feedback control circuit comprises:
a diode, comprising an anode coupled to the second input node and a cathode coupled to the control end of the fourth switch; and
a third capacitor, comprising one end coupled to the control end of the fourth switch and the cathode of the diode and the other end coupled to either the first end of the first capacitor or the second end of the first capacitor.

11. The signal converter as claimed in claim 1, wherein the first switch to the fourth switch are respectively formed by a first transistor to a fourth transistor.

12. The signal converter as claimed in claim 11, wherein a doping type of the first transistor and a doping type of the second transistor are complementary, a doping type of the third transistor and a doping type of the fourth transistor are complementary.

13. The signal converter as claimed in claim 12, wherein the doping types of the first transistor and the third transistor are same.

* * * * *